United States Patent
Alam et al.

(10) Patent No.: US 9,911,481 B1
(45) Date of Patent: Mar. 6, 2018

(54) SELECTION CIRCUIT WITH AUTOBOOTING FOR MAGNETIC MEMORY AND METHODS THEREFOR

(71) Applicant: Everspin Technologies, Inc., Chandler, AZ (US)

(72) Inventors: Syed M. Alam, Austin, TX (US); Thomas Andre, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 15/445,898

(22) Filed: Feb. 28, 2017

(51) Int. Cl.
  *G11C 11/00* (2006.01)
  *G11C 11/16* (2006.01)
  *H01L 27/22* (2006.01)
  *H01L 43/08* (2006.01)

(52) U.S. Cl.
  CPC ...... *G11C 11/1655* (2013.01); *G11C 11/1657* (2013.01); *H01L 27/228* (2013.01); *H01L 43/08* (2013.01)

(58) Field of Classification Search
  CPC ..... G11C 11/16; G11C 11/1675; G11C 11/15; G11C 11/1659; G11C 11/1673; G11C 16/30; G11C 16/3418; G11C 16/08; G11C 29/025; G11C 13/0002; G11C 11/1653; G11C 16/10; G11C 16/26
  USPC ......... 365/158, 171, 185.12, 185.03, 189.15, 365/189.07, 173, 185.21, 185.23, 185.2, 365/185.29, 189.09
  See application file for complete search history.

(56) References Cited

U.S. PATENT DOCUMENTS 6,813,181 B1    11/2004  Viehmann et al.
2004/0027907 A1*  2/2004  Ooishi ................ G11C 11/15
                                                       365/226

* cited by examiner

*Primary Examiner* — Thong Q Le
(74) *Attorney, Agent, or Firm* — Bookoff McAndrews, PLLC

(57) ABSTRACT

A selection circuit and related access circuitry that can be used for column selection in spin-torque magnetic memory is disclosed. The selection circuit can be implemented with three transistors, all of which can be NMOS transistors, thereby reducing area requirements. The selection circuit includes drive transistor that can be autobooted based on the drive voltage applied across the drive transistor. A single control signal controls the state of the selection circuit, and the selection circuits can be nested to provide multiple levels of decoding or selection.

20 Claims, 10 Drawing Sheets

OFF STATE

- SELECT INPUT = 0V
- GATE= 0V
- DRIVE OUTPUT ISOLATED FROM DRIVE INPUT

CHARGE STATE

- SELECT INPUT = > V1 + Vt
- GATE= V1
- DRIVE TRANSISTOR PASSES V1 – Vt OR LESS TO DRIVE OUTPUT

BOOT STATE

- SELECT INPUT = V1
- GATE= ISOLATED FROM V1
- GATE COUPLES UP WITH DRIVE INPUT

SELECTION CIRCUIT WITH AUTOBOOTING FOR MAGNETIC MEMORY AND METHODS THEREFOR

TECHNICAL FIELD

The disclosure herein relates generally to magnetic memory devices, and, more particularly, to circuits and methods for column selection in such memory devices.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetoresistive stack. The resistance in each magnetic tunnel junction can be varied based on the relative magnetic states of the magnetoresistive layers within the magnetoresistive stack. In such memory devices, there is typically a portion of magnetoresistive stack that has a fixed magnetic state and another portion that has a free magnetic state that is controlled to be either one of two possible states relative to the portion having the fixed magnetic state. Because the resistance through the magnetic tunnel junction changes based on the orientation of the free portion relative to the fixed portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory cell where the angular momentum carried by the spin-polarized current can change the magnetic state of the free portion of the magnetic tunnel junction. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation represents a logic "1", or vice versa. Thus, the direction of write current flow through the memory cell determines whether the memory cell is written to a first state or a second state. In such memories, the magnitude of the write current is typically greater than the magnitude of a read current used to sense the information stored in the memory cells.

Each memory cell often includes a magnetic tunnel junction coupled in series with a corresponding selection transistor that allows each memory cell to be individually selected for access. In some architectures, each memory cell is coupled between two common lines, which are often referred to as a bit line and a source line. A memory array typically includes many bit lines and source lines that allow selective access to subsets of the memory cells within the array. Word lines are coupled to the gates of the selection transistors, thereby controlling current flow through the series circuit of each memory cell based on the voltages applied to the ends of the magnetic memory cell by, for example, the bit lines and source lines.

Because a magnetic random access memory ("MRAM") may include thousands or millions of memory cells, reducing the amount of area needed for each memory cell and the associated access circuitry for the memory cell can provide for increased memory cell density. Higher memory cell density allows for greater data storage capacity in the MRAM. Therefore, it is desirable to provide access circuitry for MRAMs that efficiently enables memory operations with minimal area requirements.

DETAILED DESCRIPTION

Figure 1:
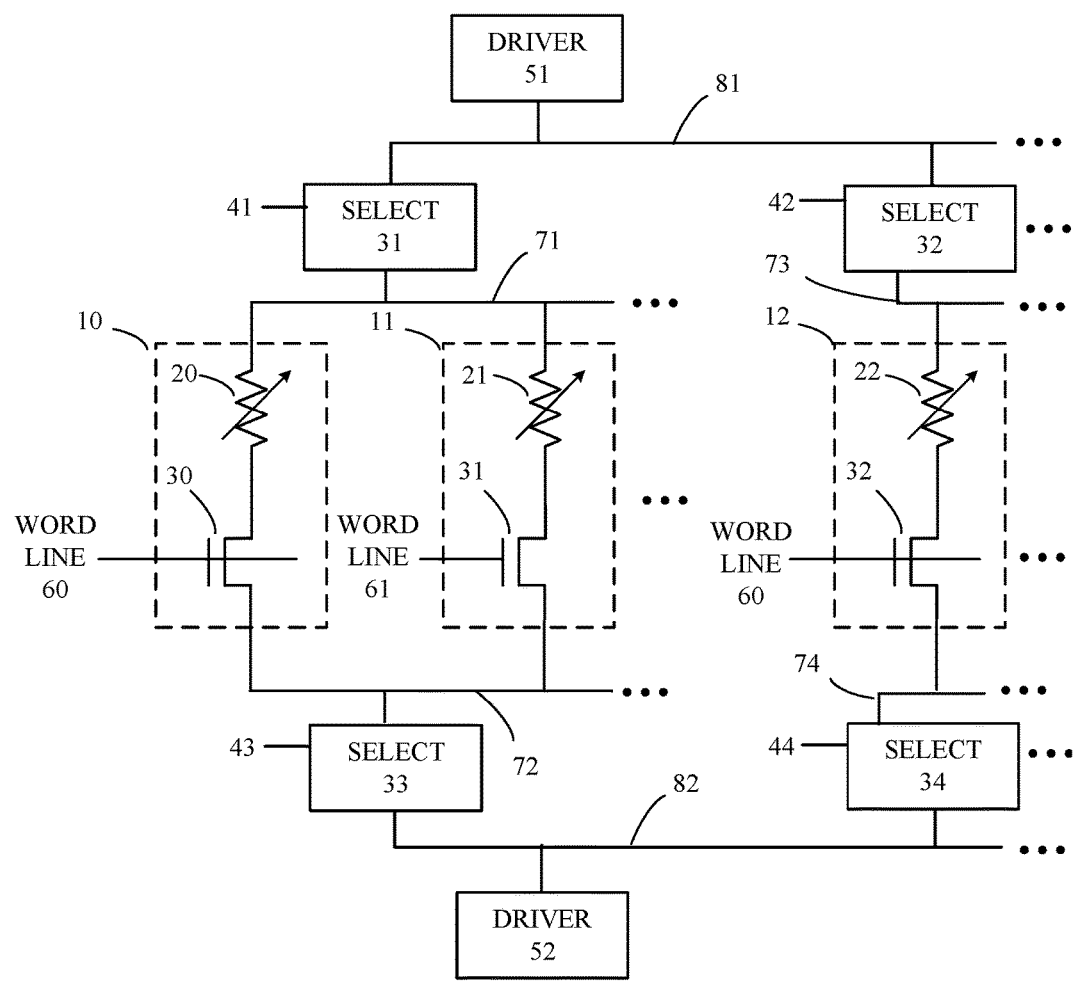
FIGS. 1 and 2 are schematic diagrams showing memory cells and associated access circuitry in accordance with exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices. Conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

During the course of this description, like numbers may be used to identify like elements according to the different figures that illustrate the various exemplary embodiments.

Magnetic memory devices and other memory devices often include an array of memory cells divided into a plurality of banks or subarrays. Each bank or subarray is typically arranged as a set of rows and columns, where accessing individual memory cells includes decoding row and column address information provided to the memory. In many prior art memory systems, such accesses were facilitated through multiplexers that decoded the received address in order to access particular rows and particular columns within the array. Such prior art multiplexers were often implemented using complementary metal oxide semiconductor (CMOS) transistors, where both p-channel metal oxide semiconductor (PMOS) and n-channel metal oxide semiconductor (NMOS) transistors provided pass gate structures that enabled various voltages to be applied to the appropriate signal lines in order to access the desired memory cells. Circuitry that includes both PMOS and NMOS transistors requires more complex processing in that only one of the two types of transistors is formed in the substrate material, and a dedicated well must be formed in order to support the other type of transistors. As such, CMOS circuits used to perform the selection operations associated with memory accesses are inefficient in terms of the amount of area required to support such circuits on an integrated circuit.

Embodiments disclosed herein present new selection circuits that can be used in memory devices such as MRAMs, where such selection circuits can be used for column selection within the MRAM array. In some embodiments, the selection circuits disclosed herein can be implemented using only NMOS transistors, thereby reducing the amount of area required for the selection circuits used to provide for column selection within the memory. The selection circuits also rely on capacitive coupling between nodes within each selection circuit in order to provide autobooting of transistor gate voltages for the drive transistors that are used to supply the current used to read and write spin torque magnetic memory cells. Such autobooting can provide power savings, simplify the timing of various signals within the memory access circuitry, and help to avoid breakdown of the drive transistors due to large voltage differentials between the gate and source of the drive transistors. Embodiments disclosed herein also utilize a single signal to facilitate the different stages of operation of the selection circuits, thereby leveraging a single signal to control whether the selection circuit is off as well as to step through the different stages associated with the selection circuit facilitating the driving of current through a memory cell.

Some embodiments described herein utilize the selection circuits in conjunction with memory architectures that include shared local source lines. In such embodiments, sizing of the drive transistors within the selection circuits can be adapted in order to further reduce area as some of the drive transistors are not required to support the entirety of the relatively high current flow associated with read and write operations in magnetic memory cells. As described below and illustrated in the figures, various embodiments provide area-efficient selection circuits that support the high currents associated with spin torque memory operations while ensuring the operations are nondestructive with respect to potential transistor breakdown based on the voltages applied to the various transistors included in the circuits.

FIG. 1 illustrates a portion of a magnetic memory that includes a plurality of magnetic memory cells 10-12. Notably, FIG. 1 only shows a few memory cells 10-12 in order to illustrate the concepts of the embodiments described as a memory array can include hundreds, thousands, hundreds of thousands or more memory cells. Each of the magnetic memory cells 10-12 includes a magnetic tunnel junction 20-22 coupled in series with a corresponding selection transistor 30-32. As shown in FIG. 1, the ends of memory cells 10 and 11 are coupled to the same common lines 71 and 72. In some embodiments, common lines 71 and 72 are a bit line and a source line. Memory cell 12 is coupled to a different set of common lines 73 and 74. In order to access memory cells 10 and 11 for sensing or write operations, line drivers 51 and 52 drive voltages on lines 81 and 82, respectively, where lines 81 and 82 include multiple access points for the selection circuits 31-34. The selection circuits are able to selectively couple the voltages on lines 81 and 82 at their corresponding access points to the common lines 71-74. Thus, each of the selection circuits 31-34 can selectively pass a voltage driving by one of the line drivers 51, 52 that is present at its corresponding access point to a corresponding common line 71-74. The control of each selection circuit 31-34 is based on a corresponding selection input signal 41-44 provided to each selection circuit.

As is illustrated, multiple memory cells are coupled to each of the common lines 71-74, and word lines 60 and 61 allow for selectivity between memory cells coupled to the same set of common lines. For example, word lines 60 and 61 select between memory cells 10 and 11. Thus, if the select inputs 41 and 43 of selection circuits 31 and 33 are driven such that the voltage sourced by line drivers 51 and 52 is passed through to lines 71 and 72, word lines 60 and 61 will determine if current flows through each of memory cells 10 and 11, respectively. If word line 60 is asserted high and word line 61 is de-asserted low, current will flow through memory cell 10 but will not flow through memory cell 11. Thus, the access to an individual memory cell is based on the selection inputs, the voltages applied by the line drivers, and the voltages driven on the word lines.

Assuming memory cell 10 is selected by the selection circuits and word lines for a sense operation used in conjunction with a read operation, the line driver 51 applies a high voltage while the line driver 52 applies a low-voltage such that a sense current flows vertically through memory cell 10 when word line 60 is asserted. With the sense current flowing through the memory cell, the resistance of the memory cell can be detected. As noted above, writing to a spin torque magnetic memory cell relies on currents flowing in different directions through the memory cell in order to write the desired state to the memory cell. Thus, for a down current write, the line driver 51 will assert a higher voltage than the line driver 52 such that downward current results. Conversely, for an up current write, line driver 52 will assert a higher voltage than line driver 51 such that a vertical current in the upward direction flows through the memory cell 10. As also noted above, the currents associated with write operations in spin torque magnetic memory cells are typically much larger than the current used for a sensing operation that is used to determine the resistance of the memory cell.

As can be seen in FIG. 1, line drivers 51 and 52 drive lines 81 and 82, respectively. Selection circuits 31-34 enable the voltages at corresponding access points on for the common lines 71-74 to be selectively applied to the common lines (e.g. bit lines and source lines) within the memory array. Thus, access point selection circuits 31-34 provide column selection within the memory array in order to allow shared line drivers to apply certain voltages only to particular bit lines and/or source lines within the memory array. As noted above, in prior art systems, similar multiplexing/decoding circuits are typically CMOS circuits that can be inefficient in terms of area requirements. Such CMOS circuits can also require complex control signals with carefully orchestrated timing in order to ensure proper coordination between the circuit elements and operation. As discussed in additional detail with respect to FIGS. 3-7 below, access point selection circuits 31-34 can be implemented with a three-transistor NMOS-only circuit that provides for column selection in an area-efficient manner that promotes simplified, robust operations in the memory.

Figure 2:
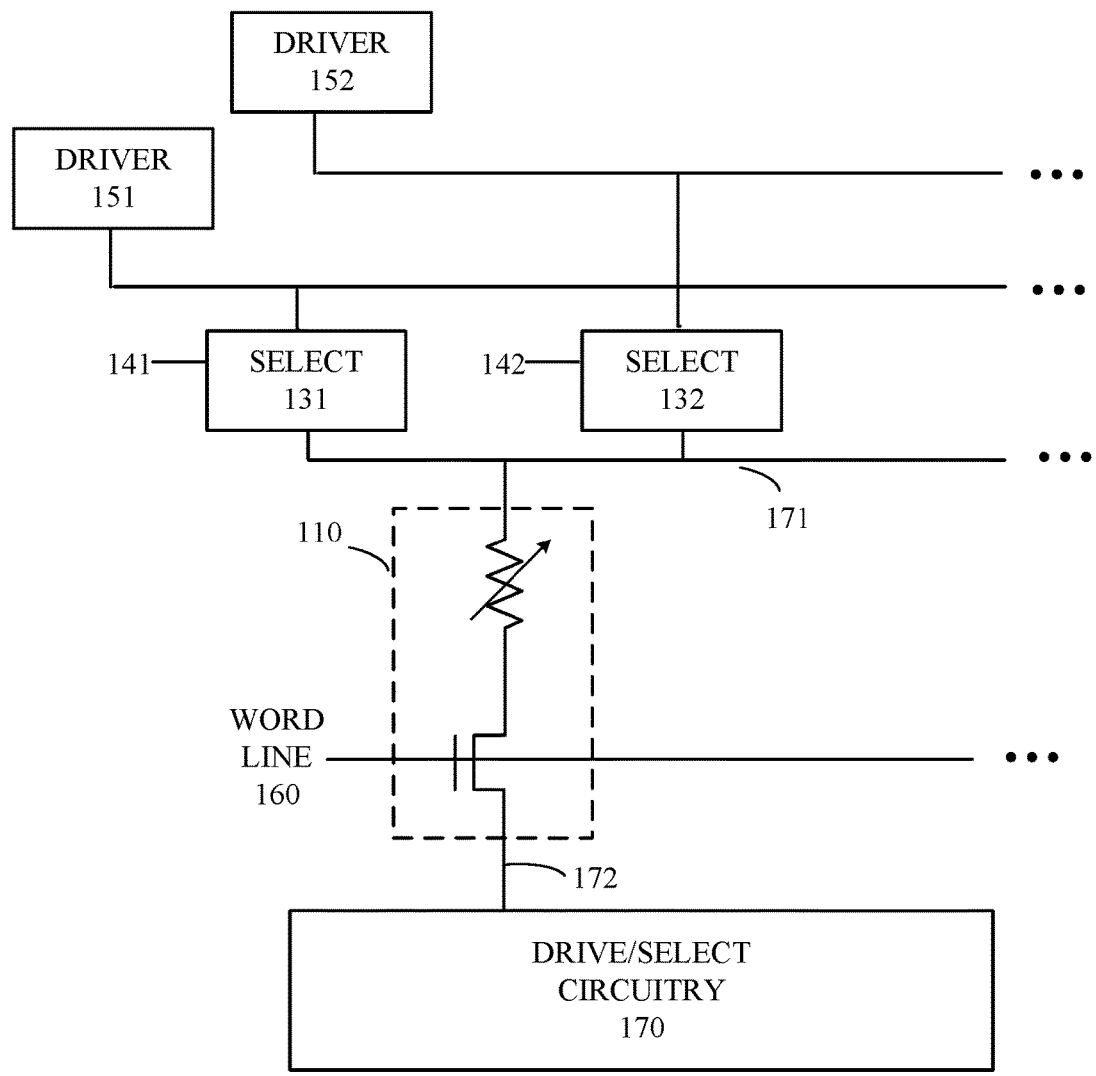

While FIG. 1 shows two line drivers 51 and 52 that are each able to supply either a high voltage or a low voltage depending upon the operation being performed, in other embodiments, such as that illustrated in FIG. 2, separate high and low line drivers are provided that can either source or sink current to be sent through the memory cells. In FIG. 2, common line 171, which in some embodiments is a bit line or a source line, can be driven by either line driver 151 or line driver 152 based on the selection signals 141 and 142 applied to the selection circuits 131 and 132. While not shown in FIG. 2, the common line 172 can also be driven by a similar set of high and low drivers that can be included in Drive/Selection circuitry 170. Notably, different driver arrangements can be used for different ends of the memory devices depending on the specific characteristics of the memory cells, the arrangement of the memory cells, and the access circuitry used in selecting the memory cells for access.

In the example of FIG. 2, if common line 171 is to be driven by line driver 151, selection input 141 can be controlled in order to cause voltage applied by line driver 151 to be passed by selection circuit 131 from onto common line 171. While line driver 151 is being employed to provide a particular voltage at the top end of the memory cell 110, the selection input 142 corresponding to selection circuit 132 is controlled to ensure that driver 152 is isolated from common line 171.

While not shown in FIG. 2, multiple memory cells are typically coupled between common lines 171 and 172, where different word lines are used to select which of those memory cells will have current flowing through them based on the voltages provided on common lines 171 and 172. For example, when asserted, word line 160 permits current flow through memory cell 110. In other instances, word line 160 will be de-asserted, thereby preventing current flow through memory cell 110 even though voltages are applied by various drivers on common lines 171 and 172 and thus at the first and second ends of the memory cell 110.

Figure 3:
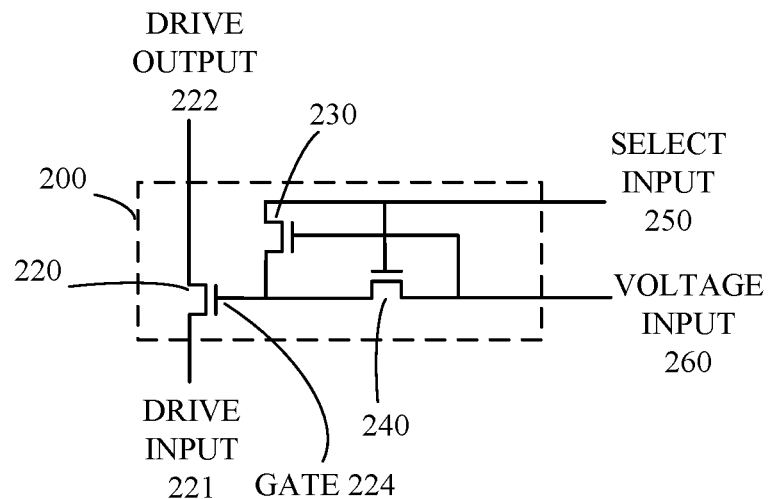
FIGS. 3-6 are schematic diagrams showing access point selection circuits in accordance with exemplary embodiments.

FIG. 3 provides a schematic drawing of one embodiment of an access point selection circuit 200, where the access point selection circuit 200 can be used as one or more of the selection circuits 31-34 and 131, 132 illustrated in FIGS. 1 and 2. In the example embodiment shown in FIG. 3, the selection circuit 200 consists of three intercoupled NMOS transistors. A first transistor 220, which may be referred to as a drive transistor, is coupled between drive input 221 and drive output 222. In the embodiment of FIG. 1, selection circuit 31 would have its drive input coupled to an access point corresponding to line driver 51, and its drive output coupled to common line 71, which corresponds to a first end of the memory cells 10 and 11. The drive transistor 220 is typically a thin gate device that is capable of driving the high currents needed to support spin torque write operations for the memory cells being accessed. Such thin oxide drive transistors are susceptible to breakdown if too large of a voltage differential is applied between the gate and source of the transistor, and, as discussed further below, the control of the selection circuit 200 helps prevent such breakdown.

Returning to the selection circuit 200 of FIG. 3, second and third transistors 240 and 230 allow for control of the drive transistor 220 based on a select signal, select input 250, that is received by the selection circuit 200. The first select transistor 240 is coupled between a gate 224 of the drive transistor 220 and a voltage input 260, where the gate of the first select transistor 240 is coupled to the select input 250. The voltage input 260 can be a node coupled to a supply voltage (e.g. VDD) or another stable voltage. In describing the various embodiments herein, the voltage input 260 of all selection circuits is assumed to be connected to a common voltage V1. However, in some embodiments, different selection circuits in the same memory are provided with different voltage inputs rather than all being provided with the same voltage input.

The second select transistor 230 is coupled between the gate 224 of the drive transistor 220 and the select input 250. The gate of the second select transistor 230 is coupled to the voltage input 260. Thus, with the voltage input 260 coupled to a stable voltage such as V1, the select input 250 provides control of the selection circuit 200 that enables the drive input 221 to be selectively gated onto the drive output 222. Thus, a single control signal applied to each selection circuit is able to provide the necessary control in order to achieve the functionality needed for each of the selection circuits used for column selection within the memory array. Moreover, by implementing the entire selection circuit 200 using only three NMOS transistors, the area required on an integrated circuit to support such a selection circuit is minimal.

Notably, drive transistor 220 is typically relatively large in comparison to select transistors 230 and 240. For example, drive transistor 220 may be a 10μ device, whereas the select transistors 230 and 240 may be on the order of 0.2μ. Notably, while the embodiments described in detail herein focus on using NMOS transistors in the selection circuits, in other embodiments, only PMOS transistors could be used in order to achieve the desired area reduction. In addition, while the embodiment of FIG. 3 shows the access point selection circuit 200 consisting only of the three NMOS transistors 220, 230, and 240, in other embodiments additional circuit elements can be included in the selection circuit 200.

Figure 4:
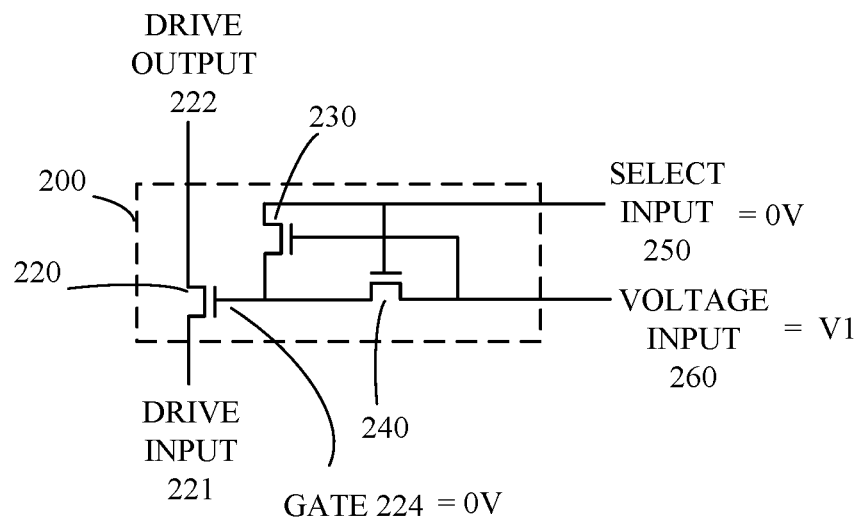
Figure 5:
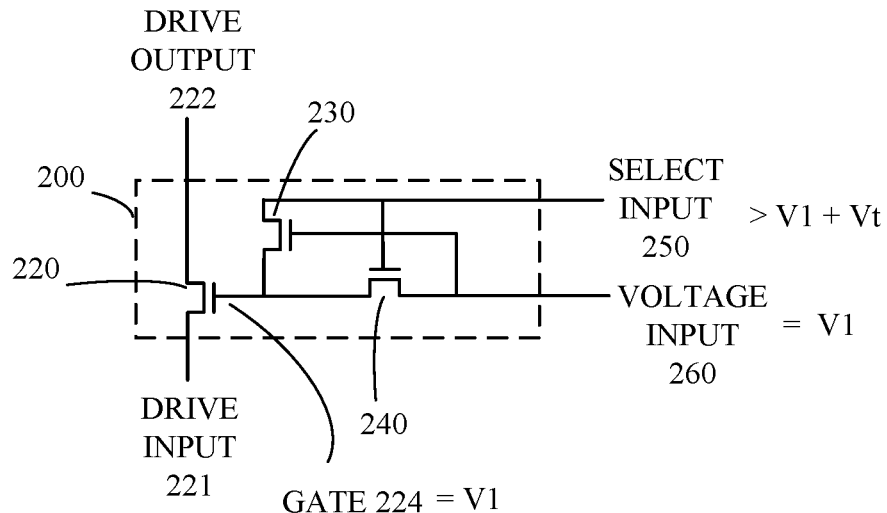
Figure 6:
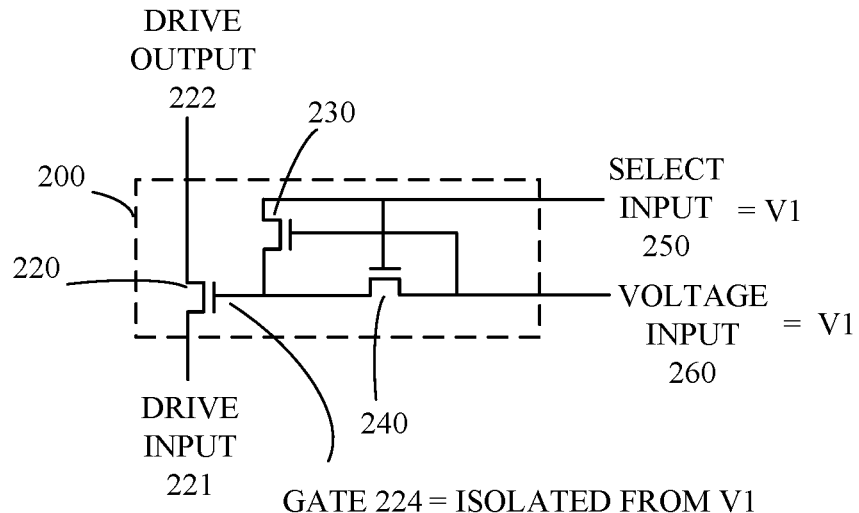

FIGS. 4-6 are provided to help illustrate the different drive states corresponding to the selection circuit 200. The control signals used for selection and control of the line drivers can be provided by control circuitry that asserts those signals in a predetermined sequence and at predetermined levels in order to sense the data stored in, and write data to, magnetic memory cells. The control circuitry, which may include, for example, a state machine, processor, microcontroller, or logic circuitry is configured to control the movement of data, and operations performed on the data, for the various memory access operations supported by the memory. In some embodiments, such control circuitry receives commands and additional signals, either sourced internal to the memory device or external from the memory device, that provide the control circuitry with information or instructions to facilitate the data storage and retrieval operations.

FIG. 4 illustrates the off state for the selection circuit 200 in which the drive output 222 is isolated from the drive input 221. The off state is achieved by deasserting the select input 250, which corresponds to applying a low voltage (e.g. 0V, ground) on the select input 250. With the select input 250 pulled low, the first select transistor 240 is off, whereas the second select transistor 230, which has V1 applied to its gate, is turned on such that it pulls the gate 224 of the drive transistor 220 low, thereby causing drive transistor 220 to isolate drive output 222 from drive input 221.

FIG. 5 illustrates the selection circuit 200 in the charge state. In the charge state the select input 250 is driven to a voltage greater than the voltage on the voltage input 260 (e.g. V1). For example, as shown in FIG. 5, the select input 250 is driven to a voltage greater than a voltage equal to the voltage V1 applied to the voltage input 260 plus the threshold voltage (Vt) of the selection transistor 240. With this voltage on the select input 250 the transistor 240 is able to fully pass the voltage at the voltage input 260 (e.g. V1) to the gate 224 of the drive transistor 220. In the charge state, the drive transistor 220 passes V1–Vt or less (depending on the state of the drive input 221) to the drive output 222. Notably, drive input 221 can be grounded when the selection circuit 200 is in the charge state. As such, the voltage at the voltage input 260 (e.g. V1 in the examples provided) is preferably a voltage that will not cause damage to the drive transistor 220 when the drive input 221 is grounded as the gate-to-source voltage for transistor 220 is established based on the voltage input 260 and the drive input 221 when the selection circuit 200 is in the charge state.

After being driven to the charge state, the selection circuit 200 can either return to the off state of FIG. 4 or driven to the boot state shown in FIG. 6. In the boot state, the select input 250 is dropped from a voltage >V1+Vt to the voltage equal to or approximately equal to the voltage on the voltage input 260, which, as shown in FIG. 6, is V1. Because the gate 224 of the drive transistor 220 was previously charged to V1 in the charge state, the gate-to-source voltage for both of the select transistors 230, 240 is 0V, thereby isolating the gate 224 from V1. As such, the gate 224 of the drive transistor is able to change voltage based on capacitive coupling between the drive input 221 and the gate 224 (i.e. the source and gate of the transistor 220). Thus, if the drive input 221 is driven to a drive voltage to be driven onto a bit line or source line in the memory array and the selection circuit is in the boot state, the gate 224 of the drive transistor 220 can rise above its initial voltage V1 in order to allow the full voltage on the drive input 221 to be passed to the drive output 222. The elevation of the voltage at the gate 224 above the voltage V1, which was established during the charge state, can be referred to as "autobooting" and is achieved by isolating the gate and allowing it to move independently of the voltages used to charge-up or drive the gate in the charge state.

Notably, the timing of the autobooting of the gate voltage in the boot state is dependent on the timing of the voltage drive on the drive input 221. Thus, if a higher gate voltage is needed for the drive transistor 220 in order to pass the voltage on the drive input 221 to the drive output 222, that higher voltage is the direct result of the drive voltage being driven on the drive input 221. Such autobooting avoids potential issues with having too large of a gate-to-source voltage on the thin-oxide drive transistor 220 that could occur if the gate 224 is directly driven to the higher voltage needed on the gate where that elevated gate voltage is driven before the voltage on the drive input has risen to a higher level, which would eventually reduce the gate-to-source voltage differential. For example, if the drive input 221 is ground and the gate 224 of the drive transistor 220 were driven to a desired line drive voltage (Vdrive) to be passed through the drive transistor plus the threshold voltage (Vt) of the transistor 220, which would equal Vdrive+Vt, the gate-to-source voltage (Vgs) of the transistor 220 can cause the transistor to breakdown from being overdriven. In contrast, with autobooting Vgs for the drive transistor never exceeds V1 as any movement above V1 at the gate 224 is due to a corresponding rise in the voltage at the source (drive input 221).

Figure 7:
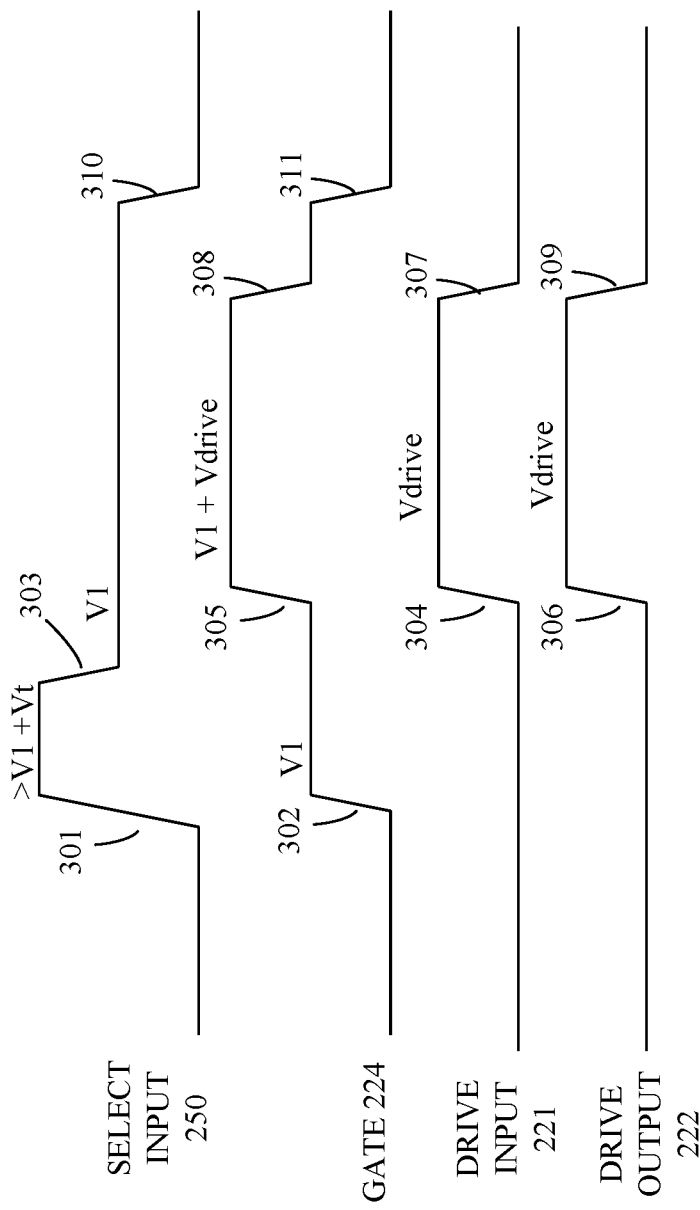
FIG. 7 is a timing diagram corresponding to operation of an access point selection circuit in accordance with an exemplary embodiment.

FIG. 7 provides a timing diagram that illustrates the various signal transitions associated with the selection circuit 200 moving through the different states shown in FIGS. 4-6. The select input 250 begins at a low voltage (e.g. ground), which corresponds to the off state shown in FIG. 4 above. In this state, the select transistor 230 holds the gate 224 low and the drive output 222 is isolated from the drive input 221.

At edge 301, the select input 250 is driven to a voltage >V1+Vt, which corresponds to the charge state. As a result of the select input 250 being driven to >V1+Vt, V1 is passed from the voltage input 260 of the selection circuit 200 to the gate 224 by the select transistor 240. This corresponds to as edge 302. As noted above, even though the drive input 221 may be grounded at this point, the voltage V1 is low enough that the Vgs on the transistor 220 does not exceed a level that would cause damage to the transistor 220.

Once the gate 224 of the drive transistor 220 is at V1, the select input 250 is reduced to V1 at edge 303, thereby isolating the gate 224 from V1 and allowing the gate 224 to float. At edge 304, the drive input 221 is driven to the voltage Vdrive, which corresponds to a voltage to be driven on a common line such as a bit line or source line. When the drive input 221 is raised to Vdrive at edge 304, and the gate 224 of the drive transistor 220, which is capacitively coupled to the drive input 221, is booted from V1 to Vdrive+V1 at edge 305, thereby allowing the drive transistor 220 to pass the full Vdrive voltage from the drive input 221 to the drive output 222 at edge 306. Notably, because the voltage on the gate 224 rises in conjunction with the rise in voltage on the drive input 221, the gate-to-source voltage on transistor 220 never exceeds the non-destructive V1 level.

When in the boot state, the selection circuit 200 is able to pass the voltage applied to the drive input 221 to the drive output 222 without degradation, thereby enabling common lines (e.g. bit lines) to be selectively driven to provide column selection functionality within the memory. Once the current associated with sensing or writing to the memory device is complete, the drive input 221 returns low at edge 307, thereby lowering gate voltage 224 at edge 308 as a result of capacitive coupling and also lowering drive output 222 at edge 309. At edge 310, the select input 310 is driven to ground, thereby returning the selection circuit 200 to the off state as the gate 224 is brought to ground at edge 311 and the drive input 221 is once again isolated from the drive output 222.

Figure 8:
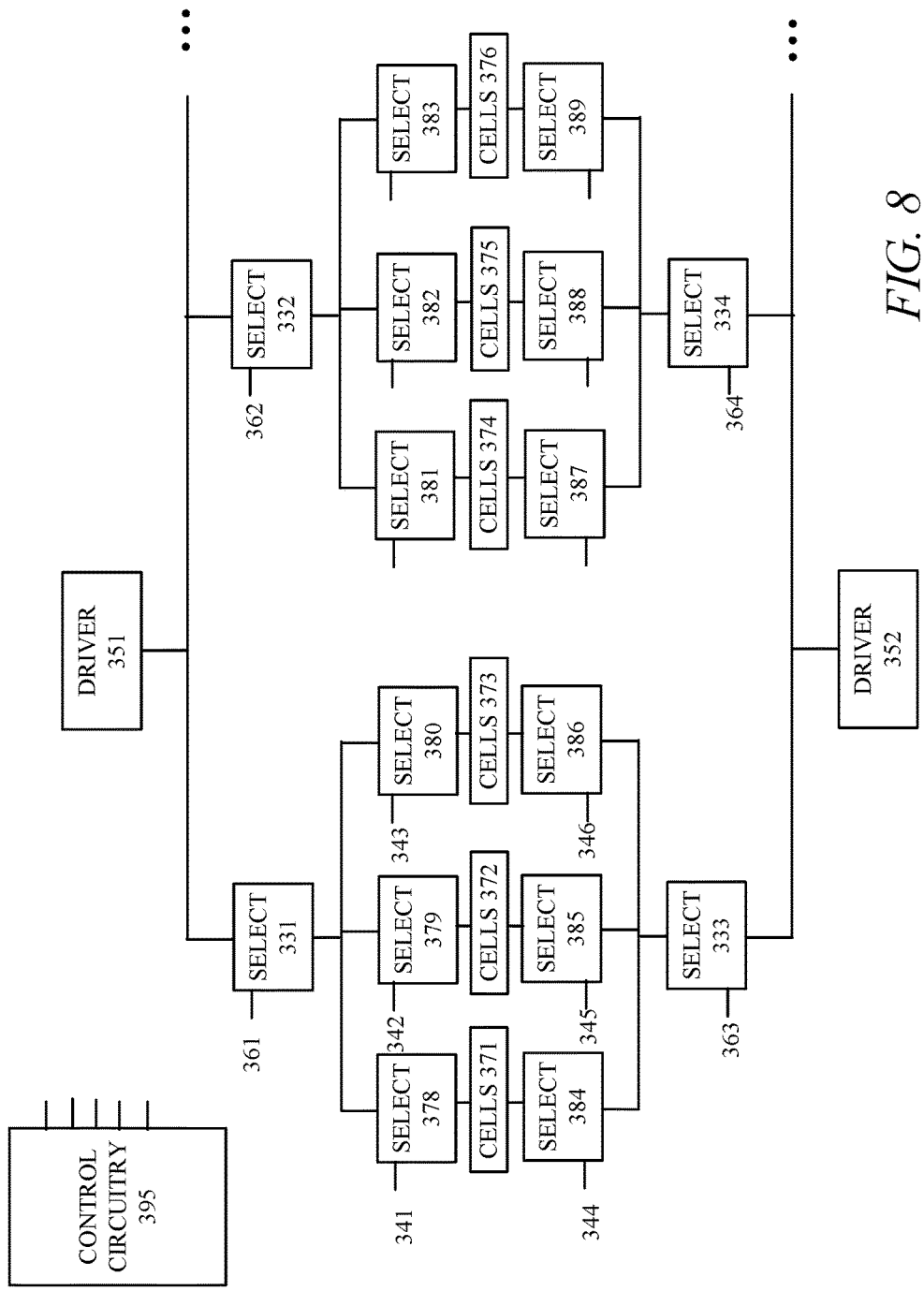
FIG. 8 is a block diagram of a portion of a magnetic memory and associated access circuitry in accordance with an exemplary embodiment.

Because the selection circuit 200 enables the full voltage on the drive input 221 to be passed through the drive transistor 220 to the drive output 222 because of the booting of the isolated gate 224, such selection circuits can be connected together in series in order to provide multiple levels of decoding without reducing the voltage level eventually driven onto the selected common line (e.g. bit line). FIG. 8 helps to illustrate this concept. In FIG. 8, control circuitry 395 provides the various control signals and settings to the various components of the circuit to facilitate sense and write operations associated with the memory cells in the memory. For example, control circuitry 395 is coupled to the selection circuits to provide the respective select signals and may also provide information to the line drivers in order to facilitate the voltage levels output by the line drivers.

In FIG. 8, multiple selection circuits are serially connected in order to provide separate levels of hierarchical decoding. For example, line drivers 351 and 352 can be used in conjunction with any of the memory cells 371-376. Each of the selection circuits 331-334 provides a coarser level of decoding in order to determine whether line drivers 351 and 352 drive current through memory cells within the set of memory cells 371-373 or the set of memory cells 374-375. If one or more memory cells in the set of memory cells 371-373 is to be accessed, the select inputs 362 and 364 can be driven low such that the selection circuits 332 and 334 are in the off state, thereby isolating their drive inputs coupled to the drivers 351 and 352 from their drive outputs, which are coupled selection circuits 381-383 and 387-389.

While selection circuits 332 and 334 are in the off state, the select inputs 361 and 363 for the selection circuits 331 and 333 can be driven to the charge state and then to the boot state in order to allow the full voltage level driven by drivers 351 and 352 to pass through selection circuits 331 and 333. While the selection inputs 361 and 363 are being driven to achieve the charge and boot states in selection circuits 331 and 333, the selection inputs of a subset of the selection circuits 341-346 can be driven in order to perform an additional level of decoding. For example, if one or more memory cells within memory cells 371 are to be accessed, then the selection signals 342, 343, 345, and 346 can be driven low to place selection circuits 379, 380, 385, and 386 in the off state. In order to pass the voltage from the outputs of the selection circuits 331 and 333 to the lines (e.g. bit lines and source lines) coupled to the memory cells 371, the select inputs 341 and 344 are driven to move the selection circuits 378 and 384 to the charge state and then the boot state. Thus, when both the selection circuit 331 and the selection circuit 378 are in the boot state, the voltage driven by the line driver 351 can be passed in full to one of the ends of one or more of the cells 371.

While FIG. 8 shows two-deep nesting of the selection circuits, one of ordinary skill in the art appreciates that multiple levels of such nesting can occur such that more than two selection circuits are coupled in series between the line drivers and the common lines coupled to the ends of the memory cells. While not shown in detail in FIG. 8, it should be understood that the memory cells within each of the blocks 371-376 can include sets of memory cells coupled to corresponding bit lines and source lines. Which of the memory cells within each block are accessed is determined by the assertion/deassertion of the word lines coupled to those memory cells. As such, the various selection circuits included in such a hierarchical arrangement provide hierarchical column decoding in a manner that is area efficient and does not result in a step-down of the voltages provided by the line drivers 351 and 352.

The access point selection circuit embodiments described herein can be used in conjunction with conventional magnetic memory arrays in which dedicated bit lines and source lines are coupled to the ends of the memory cells and separate line drivers are employed to directly drive the source lines and the bit lines. In other embodiments, rather than having source lines that are directly connected to and driven by a line driver, the access point selection circuits can be used in conjunction with shared local source line architectures where groups of memory cells share a local source line that is only connected to one end of all of the memory cells in the group and not routed to an external access point to be driven directly by a driver. Additional details regarding such local source line architectures and the operation thereof can be found in related U.S. Pat. No. 8,355,272, which issued Jan. 15, 2013, and U.S. Pat. No. 9,286,218, which issued Mar. 15, 2016. U.S. Pat. Nos. 8,355,272 and 9,286,218 are assigned to the same assignee as the present application and are incorporated by reference herein in their entirety.

Figure 9:
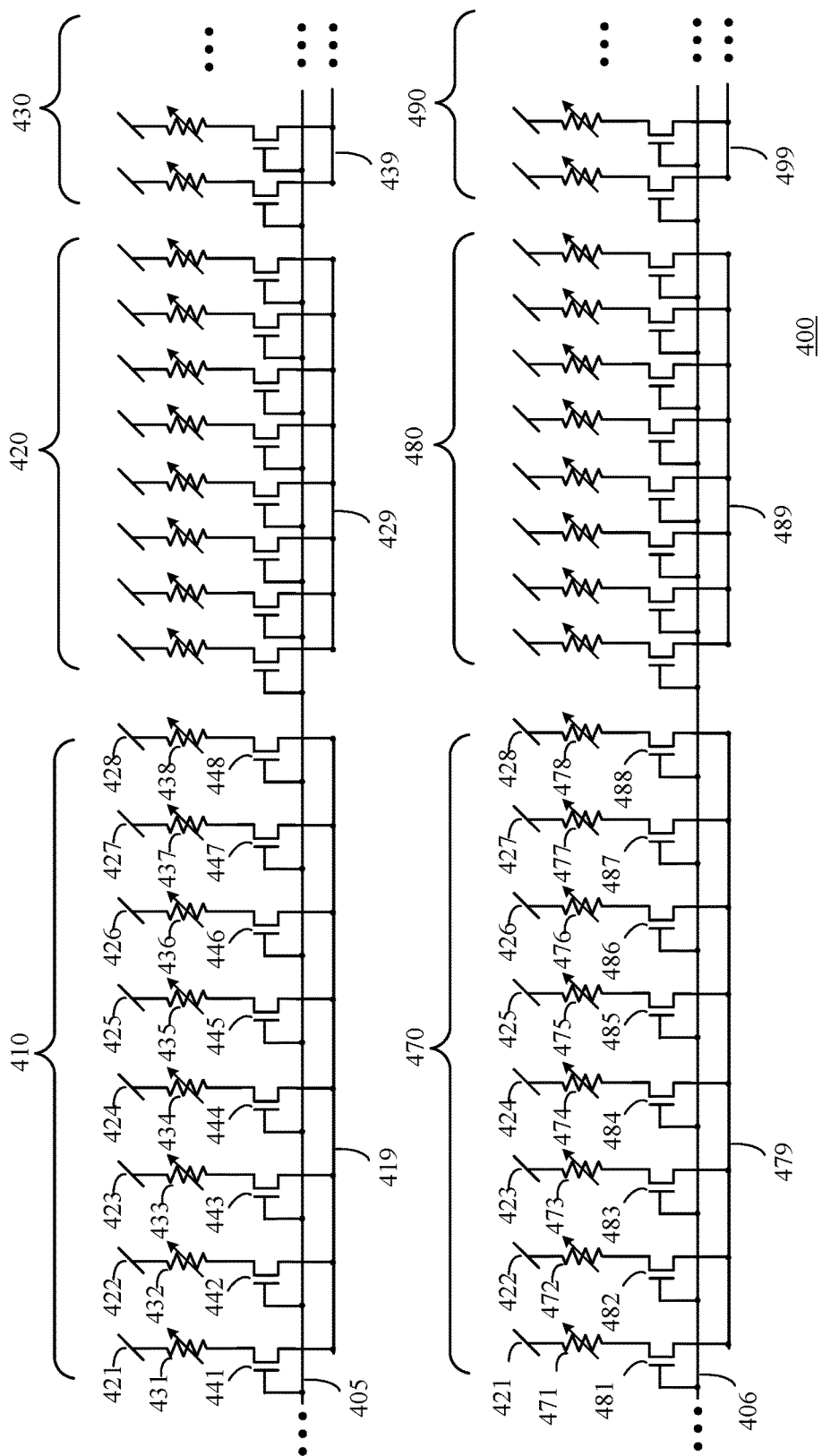
FIGS. 9-10 are schematic diagrams showing access point selection circuits used in magnetic memory with shared local source lines in accordance with exemplary embodiments.

FIG. 9 illustrates an example shared source line architecture in which each group of memory cells that shares a local source line includes eight memory cells. In other embodiments, different numbers of memory cells are included in each local source line group. For example, in some embodiments, 16 memory cells share a single local source line, whereas in other embodiments, 32 or more memory cells share local source line. FIG. 9 shows six local source line groups 410, 420, 430, 470, 480, and 490, where each local source line group has a corresponding local source line 419, 429, 439, 479, 489, and 499, respectively.

Local source line group 410 includes magnetic tunnel junctions 431-438 and corresponding selection transistors 441-448, which make up the eight memory cells included in group 410. One end of each of the memory cells is coupled to the local source line 419. While FIG. 9 shows one end of each selection transistor coupled to the local source line, the orientation of the select transistors and magnetic tunnel junctions can be reversed such that one end of the magnetic tunnel junctions is coupled to the local source line. Bit lines 421-428 are each coupled to a corresponding other end of each of memory cells in source line group 410. Word line 405 is coupled to the gates of the select transistors 441-448 as well as the select transistors in local source line groups 420 and 430.

Note that bit lines 421-428 are also coupled to the memory cells in local source line group 470, where those memory cells include magnetic tunnel junctions 471-478 and selection transistors 481-488. Bit lines 421-428 may be coupled to the memory cells in many such local source line groups that are not shown in FIG. 9. As such, when bit lines 421-428 are driven, which memory cell is accessed is determined in part by which of the word lines 405 and 406 are selected. In other embodiments, bit lines 421-428 are coupled to multiple sets of memory cells that are all coupled to the same word line such that multiple memory cells can be accessed in parallel based on the assertion of a single word line.

In the local source line architecture, one of the bit lines is used to supply the full amount of current to one side of the memory cell selected, while that same current is divided amongst the remaining bit lines in the local source line group on the other side of the selected memory cell. For example, in order to drive a down-current write current through the memory cell that includes magnetic tunnel junction 431 and select transistor 441, a high voltage is applied to the bit line 421, where a low voltage is applied to each of bit lines 422-428. The resulting current flows through magnetic tunnel junction 431, but only $\frac{1}{7}^{th}$ of that current flows through each of magnetic tunnel junctions 432-438. As such, while the total current may be sufficient to switch the magnetic state of the free portion of magnetic tunnel junction 431, the fractional current passing through each of the magnetic tunnel junctions 432-438 leaves them undisturbed.

In order to provide the desired voltages on the bit lines in such a shared source line architecture, the selection circuits discussed above can be employed. For example, each bit line 421-428 can be coupled to a pair of access point selection circuits, where one access point selection circuit provides what may be referred to as a "bit line drive" corresponding to the drive on the bit line coupled to the selected memory cell (e.g. bit line 421 in the example above in which magnetic tunnel junction 431 is written), and where the other access point selection circuit provides the "source line drive" corresponding to the drive on the bit lines corresponding to the unselected memory cells in the local source line group (e.g. bit lines 422-428 in the example). This nomenclature views the "bit line drive" in the normal sense of driving the bit line for the memory cell, but views the other bit lines, which are together functioning as a source line in terms of providing voltage to the other end of the selected memory cell via the shared source line, as being driven by the "source line drive."

Figure 10:
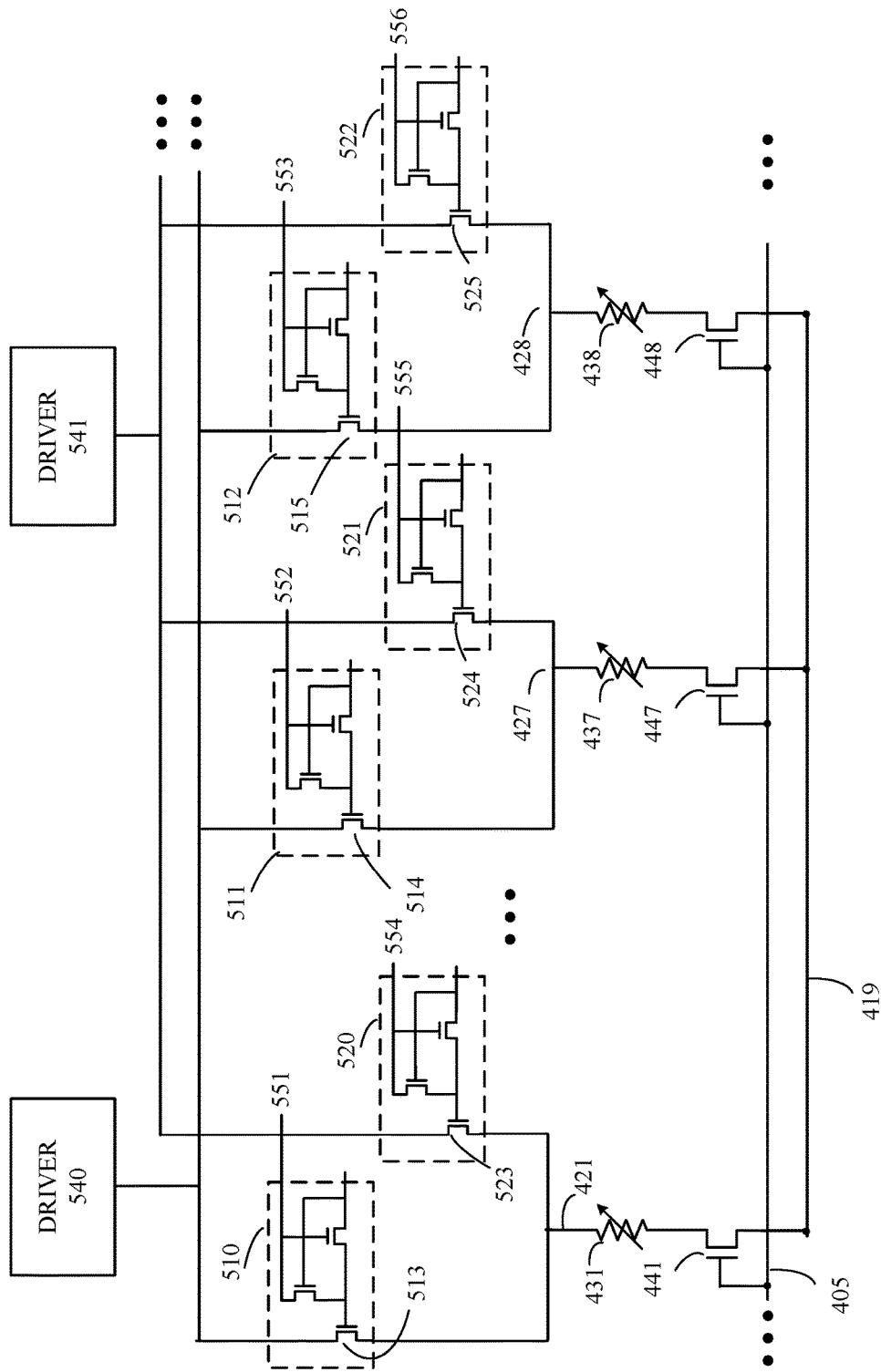

FIG. 10 illustrates a schematic diagram corresponding to a portion of the local source line group 410 of FIG. 9 with the addition of line drivers 540 and 541 as well as selection circuits 510-512 and 520-522. Note that only three of the eight bit lines and their associated memory cells are included in FIG. 10 in order to avoid overcrowding the figure. As shown in FIG. 10, each of the bit lines 421, 427 and 428, is coupled to a pair of selection circuits 510 and 520, 511 and 521, and 512 and 522, respectively. Selection circuits 510-512 are designated as "bit line drive" selection circuits, whereas selection circuits 520-522 are designated as "source line drive" selection circuits.

Repeating the example discussed above in conjunction with FIG. 9 in the context of FIG. 10, down current can be achieved in magnetic tunnel junction 431 by configuring bit line 421 to be driven by the line driver 540, which provides the "bit line drive" in this scenario, while bit lines 427 and 428 (as well as bit lines 422-426, which are not shown) are driven by the line driver 541, which serves as the "source line drive." Note that while only one line driver 541 providing the source line drive is shown, in other embodiments, the bit lines coupled to the source line drive can be coupled to multiple line drivers.

In order to provide the appropriate drive on the bit lines, the selection circuit 510, which couples one end of the magnetic tunnel junction 431 to the access point corresponding to the line driver 540, is controlled so that the drive transistor 513 passes the drive input voltage corresponding to the access point to the drive output which is coupled to bit line 421. As discussed above, this is achieved by asserting the select input 551 to move the selection circuit to the charge state and then to the boot state. Because bit line 421 is to be driven by the "boot line drive," the selection circuit 520 is placed in the off state where selection input 554 is grounded and drive transistor 523 isolates the bit line 421 from the driver 541.

The selection circuits for the remaining bit lines, including bit lines 427 and 428, are similarly controlled to connect those bit lines to the source line drive instead of the bit line drive. Thus, selection circuits 521 and 522 are first driven to the charge state and then moved to the boot state using selection inputs 555 and 556 such that the drive transistors 524 and 525 provide the voltage from the access point corresponding to driver 541 to the bit lines 427 and 428. Selection circuits 511 and 512 are held in the off state by deasserting the select inputs 552 and 553 such that the drive transistors 514 and 515 isolate the bit lines 427 and 428 from access point associated with the line driver 541. As discussed above, control circuitry coupled to the selection circuits, word lines, and line drivers is used to provide the appropriate signals and settings to achieve the desired current flow through the various memory cells.

Notably, while the full sense or write current flowing through a memory cell is passed through the drive transistors in the selection circuits 510-512 coupled to the "bit line drive" access points, only a fraction (e.g. $1/7^{th}$, $1/15^{th}$, or $1/32^{nd}$ in some example embodiments) is passed through each of the drive transistors in the selection circuits 520-522 coupled to the "source line drive" access points. As such, even more area savings can be achieved by appropriate sizing of the drive transistors in the different selection circuits coupled to different access points. Because less current flows through the drive transistors in selection circuits 520-522, those drive transistors 523-525 can be smaller than the drive transistors 513-515 that are required to pass more current to support the bit line drive. In one example embodiment, the transistors 513-515 are at least three times larger than transistors 523-525. The 3:1 ratio may be based in part on maintaining an efficient layout of the transistors. In other embodiments, the sizing ratio corresponds to the number of bit lines included in each local source line group.

FIG. 10 only shows a portion of one local source line group. In some embodiments, multiple local source line groups can share the same select inputs in order to access multiple bits in different local source line groups at the same time. For example, the same select inputs applied to the bit lines for local source line group 410 of FIG. 9 can be applied to groups 420 and 430 in order to access three memory cells using the same select inputs. In one example embodiment, 32 separate shared source line groups are accessed simultaneously in order to access 32 bits in parallel.

Figure 11:
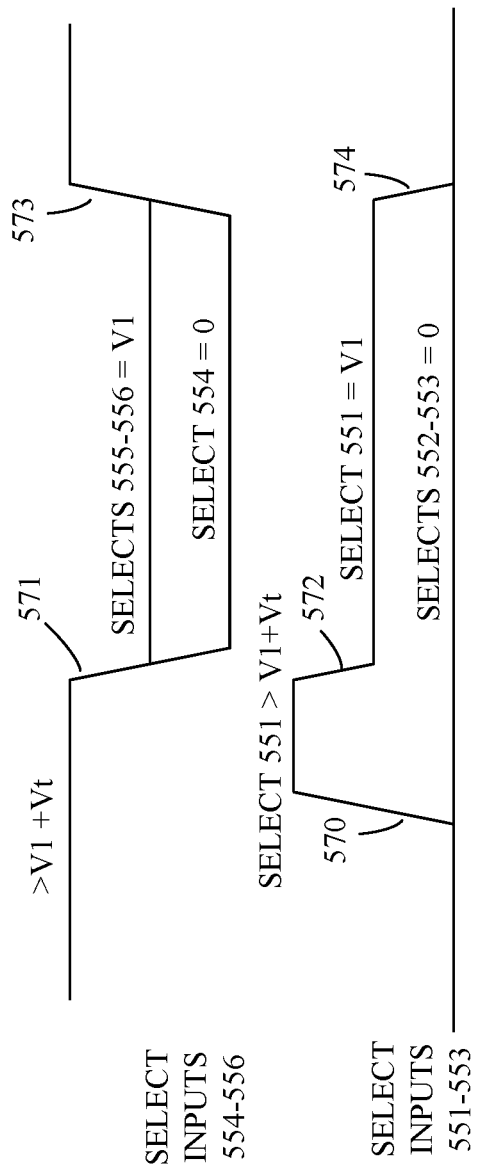
FIG. 11 is a timing diagram corresponding to operation of an access point selection circuit in conjunction with a shared local source line in accordance with an exemplary embodiment.

FIG. 11 provides a timing diagram that illustrates the signal transitions corresponding to an example operation in the memory portion of FIG. 10 in which the memory cell that includes magnetic tunnel junction 431 and selection transistor 441 is accessed. In the steady state before the operation begins, it may be desirable to drive the selection inputs 554-556 for all of the selection circuits corresponding to the "source line drive" to >V1+Vt in order to have the gate voltages of all of the corresponding drive transistors 523-524 of those selection circuits 520-522 already biased to the input voltage level (e.g. V1). Because the select inputs 554-556 of the "source line drive" select circuits 520-522 are driven to >V1+Vt in the steady state, the selection circuits 520-522 corresponding to the "source line drive" are active or on and the drive transistors 523-525 of those selection circuits allow line driver 541 in FIG. 10 to apply a fixed voltage to all the bitlines 421, 427, 428 through the selection circuits 520-522 corresponding to the "source line drive." In some embodiments, the voltage applied to all of the bitlines 421, 427, 428 is ground, whereas in other embodiments it may be beneficial to hold the bitlines at a non-ground voltage such as, for example, a voltage less than or equal to 0.3V. In yet other embodiments, the bit lines are held at a slightly higher voltage, on the order of 0.5-0.6V. Thus, with the select inputs 554-556 at >V1+Vt in the steady state, all of the bit lines can be maintained at a fixed voltage, which, in some embodiments is ground or a low voltage.

Moreover, having all of the "source line drive" transistors 523-525 turned on and active in the steady state helps avoid current spikes as large numbers of "source line drive" transistors do not need to be turned on at the same time for a memory cell access. For example, if a local source line group includes 32 memory cells, during a memory access 31 of the bit lines will be driven by the "source line drive" and only one of the bit lines will be driven by the "bit line drive." As such, if the "source line drive" select circuits are off in the steady state, 31 of them will have to be turned on for each memory access, which can result in large simultaneous current demand. By having all of the "source line drive" selection circuits turned on in the steady state, only one has to be switched off while the others remain on.

Similarly, the select inputs for the selection circuits corresponding to the "bit line drive" may be maintained in the off state between operations. As such, FIG. 11 shows that all of the select inputs 554-556 corresponding to the "source line drive" selection circuits are initially driven to a voltage corresponding to the charge state (e.g. >V1+Vt) such that the gates of the drive transistors corresponding to those select inputs are maintained at V1. Select inputs 551-553 are initially ground, thereby isolating the bit lines from the bit line drive.

At edge 570, select input 551, which corresponds to selection circuit 510, is driven to >V1+Vt in order to place the selection circuit 510 in the charge state and raise the voltage at the gate of transistor 513 from ground to V1. At edge 572, select input 551 is lowered to V1, thereby placing selection circuit 510 in the boot state, and allowing the drive transistor 513 to fully pass the bit line drive voltage. Note that during the time the select signal 551 is driven to V1, the gate voltage on transistor 513 may autoboot and move with the voltage provided by line driver 540.

While selection circuit 510 is in the boot state, the selection circuit 520, which also corresponds to bit line 421 is in the off state. This corresponds to edge 571 where select input 554 is driven to ground, thereby isolating the source line drive from the bit line 421. Select inputs 555 and 556, which were initially at >V1+Vt, are lowered to V1 at edge 571, such that the selection circuits 521 and 522 go to the boot state at about the same time that selection circuit 510 goes to the boot state. Thus, selection circuits 521 and 522 will pass the voltage from the access point corresponding to line driver 541, which is the source line drive in this example, to the bit lines 427 and 428. By providing two selection circuits for each bit line in the local source line architecture, each bit line can be configurably coupled to either a bit line drive access point or a source line drive access point, thereby enabling selective access to individual memory cells or groups of memory cells. Depending on the drive voltage provided by the respective line drivers, sense or write operations can be performed corresponding to the select memory cell(s).

Figure 12:
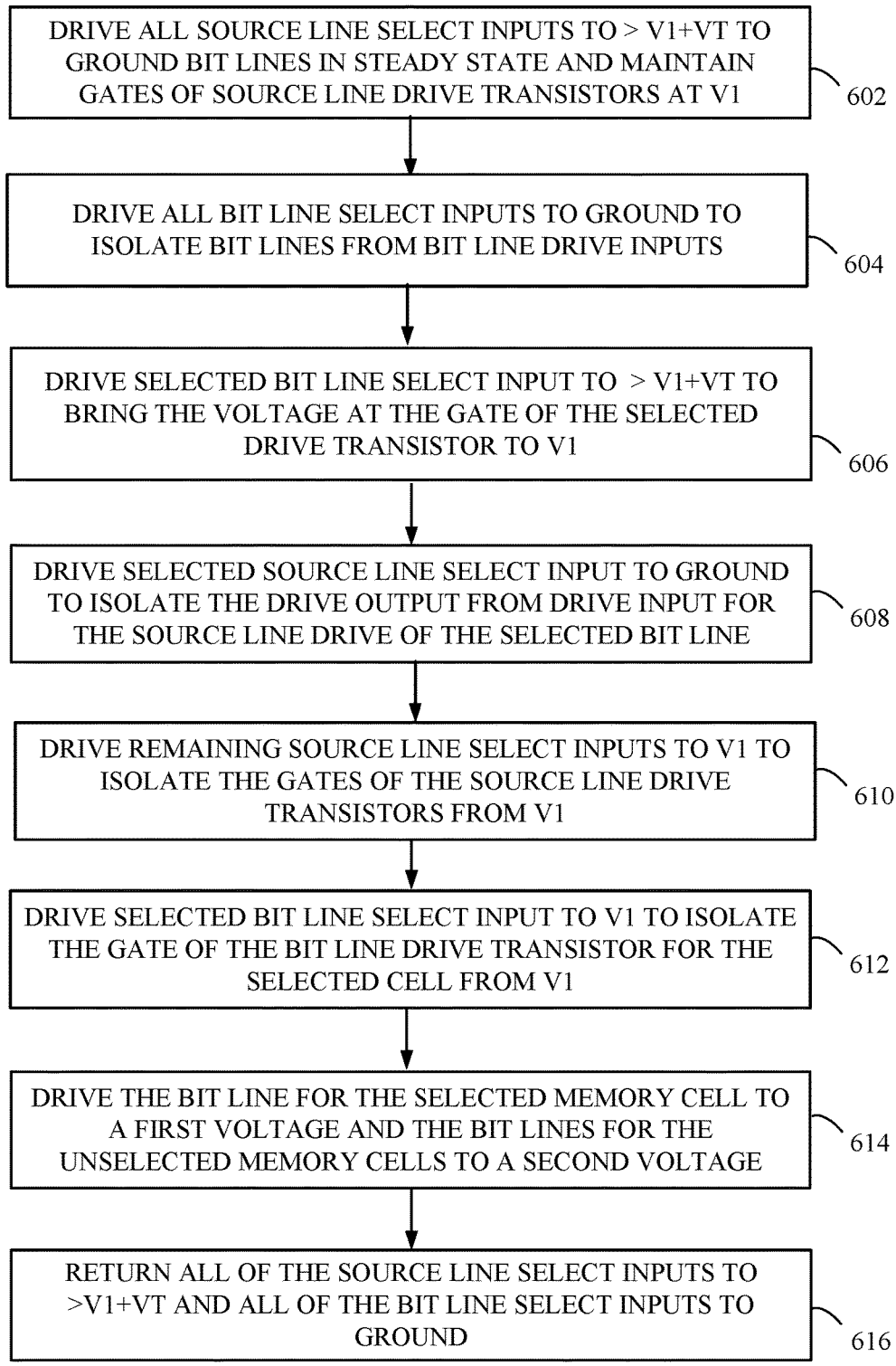
FIG. 12 is a flow chart corresponding to a method for operating an access point selection circuit in accordance with an exemplary embodiment.

FIG. 12 is a flow chart that illustrates an exemplary embodiment for performing selection operations using the selection circuits described above. In one example, the selection corresponds to column selection performed for an array of spin-torque magnetic tunnel junction memory cells. The operations included in the flow chart may represent only a portion of the overall process used to operating the device. For illustrative purposes, the following description of the method in FIG. 12 may refer to elements mentioned above in connection with FIGS. 9-11. It should be appreciated that method may include any number of additional or alternative tasks, the tasks shown in FIG. 12 need not be performed in the illustrated order, and the methods may be incorporated into a more comprehensive procedure or process having additional functionality not described in detail herein. Moreover, one or more of the tasks shown in FIG. 12 could be omitted from an embodiment as long as the intended overall functionality remains intact.

At 602 all of the source line select inputs are driven to >V1+Vt in order to ground all of the bit lines in the steady-state and maintain the gates of the source line drive transistors at V1. At 604, all of the bit line select inputs are driven to ground to isolate the bit lines from the bit line drive inputs. Thus, steps 602 and 604 correspond to the initial state of the select inputs in the circuit illustrated in FIG. 10, where those initial states are also reflected on the left-hand side of the timing diagram shown in FIG. 11.

At 606 a selected bit line select input is driven to V1+Vt to place the corresponding selection circuit in the charge state. For example, bit line select input 551 in FIG. 10 is driven in order to place the gate voltage of drive transistor 513 at voltage V1. In the example where the memory cell that includes magnetic tunnel junction 431 is the selected memory cell such that the bit line 421 is to be coupled to the access point for the bit line drive and the bit lines 427 and 428 are to be coupled to the access point for the source line drive, the source line drive selection circuit for bit line 421 is placed in the off state where select input 554 is driven to ground to isolate the drive output of selection circuit 520 from the line driver 541.

At 610 the remaining source line select inputs in the local source line group are driven to V1 to place the selection circuits in the boot state in which the gates of the source line drive transistors are isolated from the voltage V1. This allows the source line drive transistors (e.g. 524, 525) to provide the desired voltage on the source line side 419 of the selected memory cell, which may include autobooting if necessary.

At 612 the selected bit line select input is driven to V1 to put the select circuit 510 in the boot state in which the gate of the bit line drive transistor for the selected memory cell is isolated from V1. This allows the bit line drive transistor (e.g. 513) to provide the desired voltage on the bit line side 421 of the selected memory cell, which may include autobooting if necessary.

At 614 the line drivers 540 and 541 are used to apply a voltage across the selected memory cell such that a desired current flows through the memory cell, which can be part of a sense or a write operation. Thus, the bit line 421 is driven to a first voltage using selection circuit 510 and line driver 540 while the remaining bit lines in the local source line group, including bit lines 427 and 428 are driven to a second voltage using selection circuits 521 and 522 and line driver 541. At 616, after the current has been initiated through the selected memory cell, the selection circuits are returned to the steady state in which all the source line select inputs are driven to >V1+Vt and all the bit line select inputs are driven to ground.

The access point selection circuit and related access circuitry described herein provides for selection and decoding operations, including column select operations, in an area efficient manner that enables higher density MRAM arrays. Additional advantages include control of the selection circuits using a single selection input signal that is able to determine if the selection circuit is in the off state, charge state, or boot state. In embodiments that utilize a shared local source line, having a pair of such selection circuits coupled to each bit line allows for different sized drive transistors to be used for the "bit line drive" and "source line drive" bit lines. The selection circuits can be nested such that multiple hierarchical levels of decoding are possible without drive voltage degradation.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied.

The particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetic memory apparatus, comprising:
a first memory cell that includes a first select transistor coupled in series with a first magnetic tunnel junction; and
a first selection circuit coupled to a first end of the first memory cell, wherein the first selection circuit includes:
a first access point selection circuit that includes:
a first transistor coupled between the first end of the first memory cell and a first access point;
a second transistor coupled between a gate of the first transistor and a first voltage node, wherein a gate of the second transistor is coupled to a first select signal; and
a third transistor coupled between the gate of the first transistor and the first select signal, wherein a gate of the third transistor is coupled to the first voltage node; and
a second access point selection circuit that includes:
a fourth transistor coupled between the first end of the first memory cell and a second access point;
a fifth transistor coupled between a gate of the fourth transistor and a second voltage node, wherein a gate of the fifth transistor is coupled to a second select signal; and
a sixth transistor coupled between the gate of the fourth transistor and the second select signal, wherein a gate of the sixth transistor is coupled to the second voltage node.

2. The magnetic memory apparatus of claim 1, wherein all of the first, second, third, fourth, fifth, and sixth transistors are NMOS transistors.

3. The magnetic memory apparatus of claim 1, wherein the first transistor is at least three times as large as the fourth transistor.

4. The magnetic memory apparatus of claim 1, wherein the first voltage node and the second voltage node are both coupled to a same voltage.

5. The magnetic memory apparatus of claim 1, wherein:
when the first select signal is at a low voltage, the first transistor is configured to isolate the first end of the first memory cell from the first access point; and
when the second select signal is at a low voltage, the fourth transistor is configured to isolate the first end of the first memory cell from the second access point.

6. The magnetic memory apparatus of claim 5, wherein the first access point corresponds to a line configured to be driven by a bit line driver and the second access point corresponds to a line configured to be driven by a source line driver.

7. The magnetic memory apparatus of claim 5, wherein when the first select signal is driven to a voltage that is at least a threshold voltage greater than a voltage at the first voltage node, the second transistor is configured to pass a voltage at the first voltage node to the gate of the first transistor.

8. The magnetic memory apparatus of claim 1, further comprising:
a plurality of additional memory cells, wherein each memory cell of the plurality of additional memory cells includes a select transistor coupled in series with a magnetic tunnel junction; and
a plurality of additional line drive circuits, wherein a first end of each additional memory cell is coupled to a corresponding additional line drive circuit of the plurality of additional line drive circuits, and wherein a second end of each additional memory cell is coupled to a second end of the first memory cell.

9. The magnetic memory apparatus of claim 8, wherein the second end of each additional memory cell of the plurality of additional memory cells is coupled to the second end of the first memory cell via a shared local source line.

10. The magnetic memory apparatus of claim 1, wherein the first access point is coupled to a first common line, and wherein the magnetic memory apparatus further comprises:
a third access point selection circuit that includes:
a seventh transistor coupled between the first common line and a third access point;
an eighth transistor coupled between a gate of the seventh transistor and the first voltage node, wherein a gate of the eighth transistor is coupled to a first second-level column select signal; and
a ninth transistor coupled between the gate of the seventh transistor and the first second-level column select signal, wherein a gate of the ninth transistor is coupled to the first voltage node.

11. A magnetic memory apparatus, comprising:
a first memory cell that includes a first select transistor coupled in series with a first magnetic tunnel junction;
a first access point selection circuit that includes:
a first transistor coupled between a first end of the first memory cell and a first access point;
a second transistor coupled between a gate of the first transistor and a first voltage node, wherein a gate of the second transistor is coupled to a first select signal; and
a third transistor coupled between the gate of the first transistor and the first select signal, wherein a gate of the third transistor is coupled to the first voltage node; and
a plurality of additional memory cells, wherein each memory cell of the plurality of additional memory cells includes a select transistor coupled in series with a magnetic tunnel junction; and
a plurality of second access point selection circuits, wherein a first end of each additional memory cell is coupled to a corresponding second access point selection circuit of the plurality of second access point selection circuits, and wherein a second end of each additional memory cell is coupled to a second end of the first memory cell, wherein each of the second access point selection circuits includes:
a fourth transistor coupled between the first end of the additional memory cell and a second access point;
a fifth transistor coupled between a gate of the fourth transistor and a second voltage node, wherein a gate of the fifth transistor is coupled to a select signal corresponding to the second access point selection circuit; and a sixth transistor coupled between the gate of the fourth transistor and the select signal corresponding to the second access point selection circuit, wherein a gate of the sixth transistor is coupled to the second voltage node.

12. The magnetic memory apparatus of claim 11 further comprising control circuitry coupled to the first memory cell, the first access point selection circuit, the plurality of additional memory cells, and the plurality of second access point selection circuits, the control circuitry configured to drive the first select signal and each of the select signals corresponding to the second access point selection circuits such that a current flows through the first memory cell and a fraction of the current flows through each memory cell of the plurality of additional memory cells.

13. The magnetic memory apparatus of claim 12, wherein the control circuitry is configured to drive the first select signal i) from an initial low state to a charge state during which the first select signal is a threshold voltage above a voltage at the first voltage node, and ii) from the charge state to a boot state in which the first select signal is equal to the voltage at the first voltage node such that the gate of the first transistor is isolated from the first voltage node.

14. The magnetic memory apparatus of claim 13, wherein the gate of the first transistor is capacitively coupled to the first access point, wherein when the first access point is driven to a voltage greater than the voltage at the first voltage node and the first select signal is in the boot state, voltage at the gate of the first transistor is elevated above the voltage at the first voltage node.

15. The magnetic memory apparatus of claim 12 further comprising a plurality of bit lines, wherein for each second access point selection circuit, a corresponding bit line of the plurality of bit lines couples the fourth transistor to the first end of the additional memory cell; and wherein the control circuitry is configured to, prior to driving the first select signal and each of the select signals corresponding to the second access point selection circuits such that the current flows through the first memory cell, drive each of the select signals corresponding to the plurality of second access point selection circuits to a charge state in which the fourth transistor of each of the second selection circuits allows a line driver coupled to the second access point to apply ground or a low voltage to a corresponding bit line of the plurality of bit lines.

16. The magnetic memory apparatus of claim 11, wherein all of the transistors in the access point selection circuits are NMOS transistors.

17. The magnetic memory apparatus of claim 10, wherein the second end of each additional memory cell is coupled to the second end of the first memory cell via a shared local source line.

18. A magnetic memory apparatus, comprising:
a first memory cell that includes a first select transistor coupled in series with a first magnetic tunnel junction;
a second memory cell that includes a second select transistor coupled in series with a second magnetic tunnel junction, wherein a first end of the first memory cell is coupled to a first end of the second memory cell; and
a plurality of access point selection circuits, wherein each access point selection circuit of the plurality of access point selection circuits includes a select input, a voltage input, a drive input, and a drive output, wherein each access point selection circuit includes:
  a drive transistor coupled between the drive input and the drive output of the access point selection circuit;
  a first select transistor coupled between a gate of the drive transistor and the voltage input of the access point selection circuit, wherein a gate of the first select transistor is coupled to the select input of the access point selection circuit; and
  a second select transistor coupled between the gate of the drive transistor and the select input, wherein a gate of the second select transistor is coupled to the voltage input;
wherein the plurality of access point selection circuits includes:
  a first access point selection circuit, wherein the drive output of the first access point selection circuit is coupled to a second end of the first memory cell; and
  a second access point selection circuit, wherein the drive output of the second access point selection circuit is coupled to a second end of the second memory cell.

19. The magnetic memory apparatus of claim 18, wherein the plurality of access point selection circuits further comprises:
a third access point selection circuit, wherein the drive output of the third access point selection circuit is coupled to the second end of the first memory cell, wherein the select input of the first access point selection circuit is coupled to a first select signal, and wherein the select input of the third access point selection circuit is coupled to a second select signal.

20. The magnetic memory apparatus of claim 19, wherein the drive input of the first access point selection circuit is coupled a first line driver, and wherein the drive input of the third access point selection circuit is coupled to a second line driver.

* * * * *